(12) United States Patent
Son et al.

(10) Patent No.: US 10,818,375 B2
(45) Date of Patent: Oct. 27, 2020

(54) SEMICONDUCTOR MEMORY DEVICES, MEMORY SYSTEMS AND METHODS OF OPERATING SEMICONDUCTOR MEMORY DEVICES

(71) Applicant: SAMSUNG ELECTRONICS CO., LTD., Suwon-si, Gyeonggi-do (KR)

(72) Inventors: Jong-Pil Son, Seongnam-si (KR); Kyo-Min Sohn, Yongin-si (KR)

(73) Assignee: Samsung Electronics Co., Ltd., Suwon-si, Gyeonggi-Do (KR)

( * ) Notice: Subject to any disclaimer, the term of this patent is extended or adjusted under 35 U.S.C. 154(b) by 202 days.

(21) Appl. No.: 16/028,783

(22) Filed: Jul. 6, 2018

(65) Prior Publication Data
US 2019/0130991 A1  May 2, 2019

(30) Foreign Application Priority Data

Nov. 2, 2017  (KR) .................. 10-2017-0145251

(51) Int. Cl.
| *G06F 11/00* | (2006.01) |
| *G11C 29/42* | (2006.01) |
| *G06F 11/22* | (2006.01) |
| *G06F 11/10* | (2006.01) |
| *G11C 29/02* | (2006.01) |

(52) U.S. Cl.
CPC .......... *G11C 29/42* (2013.01); *G06F 11/1064* (2013.01); *G06F 11/2215* (2013.01); *G11C 29/02* (2013.01)

(58) Field of Classification Search
CPC .. G06F 11/1064; G06F 11/2215; G11C 29/42; G11C 29/02
See application file for complete search history.

(56) References Cited

U.S. PATENT DOCUMENTS

| 6,539,503 | B1 * | 3/2003 | Walker | G01R 31/3183 714/32 |
| 7,457,996 | B2 * | 11/2008 | Kobayashi | G11C 29/44 365/201 |
| 7,567,461 | B2 * | 7/2009 | Roohparvar | G11C 8/10 365/185.11 |
| 7,945,840 | B2 * | 5/2011 | Schreck | G06F 11/1056 714/762 |
| 8,181,100 | B1 | 5/2012 | Purdham et al. | |
| 8,627,163 | B2 | 1/2014 | Ito et al. | |
| 8,645,797 | B2 | 2/2014 | Yigzaw et al. | |
| 8,873,949 | B2 * | 10/2014 | Kotrla | H04B 10/0775 398/27 |

(Continued)

*Primary Examiner* — Esaw T Abraham
(74) *Attorney, Agent, or Firm* — Lee IP Law, PC

(57) ABSTRACT

A semiconductor memory device which includes a memory cell array, an error injection register set, a data input buffer, a write data generator, and control logic. The error injection register set stores an error bit set, including at least one error bit, based on a first command. The error bit set is associated with a data set to be written in the memory cell array. The data input buffer stores the data set to be written in the memory cell array based on a second command. The write data generator generates a write data set to be written in the memory cell array based on the data set and the error bit set. The control logic controls the error injection register set and the data input buffer.

20 Claims, 16 Drawing Sheets

(56) References Cited

U.S. PATENT DOCUMENTS

| | | | | |
|---|---|---|---|---|
| 8,914,687 B2 * | 12/2014 | Gold | ................... | G06F 11/2215 |
| | | | | 714/718 |
| 8,972,653 B2 * | 3/2015 | Lin | ..................... | G06F 12/0246 |
| | | | | 711/103 |
| 9,355,715 B1 * | 5/2016 | Kim | ..................... | G11C 11/5642 |
| 9,405,646 B2 * | 8/2016 | Yigzaw | ................. | G06F 11/263 |
| 9,563,548 B2 | 2/2017 | Curley et al. | | |
| 9,904,596 B2 * | 2/2018 | Kwon | ................. | G06F 11/1048 |
| 2013/0139008 A1 | 5/2013 | Kalyanasundharam et al. | | |
| 2013/0346798 A1 | 12/2013 | Moyer | | |
| 2015/0074473 A1 | 3/2015 | Unesaki | | |
| 2016/0343453 A1 | 11/2016 | Yigzaw et al. | | |
| 2017/0147484 A1 | 5/2017 | Kumar et al. | | |
| 2018/0174665 A1 * | 6/2018 | Kraipak | ................. | G11C 29/38 |

\* cited by examiner

FIG. 6

|  | DQ1 | DQ2 | DQ3 | . . . | DQk |
|---|---|---|---|---|---|
| EB_BL_SG1 | V | V | V | . . . | V |
| EB_BL_SG2 | V | V | V | . . . | V |
| EB_BL_SG3 | V | V | V | . . . | V |
| ⋮ | ⋮ | ⋮ | ⋮ | ⋮ | ⋮ |
| EB_BL_SGk | V | V | V | V | V |

V=L : NO ERROR INJECTION

V=H : ERROR INJECTION

FIG. 7

|  | DQ1 | DQ2 | DQ3 | . . . | DQk |
|---|---|---|---|---|---|
| EB_BL_SG1 | H | L | L | . . . | L |
| EB_BL_SG2 | L | L | L | . . . | L |
| EB_BL_SG3 | L | L | L | . . . | L |
| ⋮ | ⋮ | ⋮ | ⋮ | ⋮ | ⋮ |
| EB_BL_SGk | L | L | L |  | L |

FIG. 8

|            | DQ1 | DQ2 | DQ3 | · · · | DQk |
|------------|-----|-----|-----|-------|-----|
| EB_BL_SG1  | L   | L   | L   | · · · | L   |
| EB_BL_SG2  | H   | L   | L   | · · · | L   |
| EB_BL_SG3  | H   | L   | L   | · · · | L   |
| ⋮          | ⋮   | ⋮   | ⋮   | ⋮     | ⋮   |
| EB_BL_SGk  | L   | L   | L   | · · · | L   |

FIG. 9

|            | DQ1 | DQ2 | DQ3 | · · · | DQk |
|------------|-----|-----|-----|-------|-----|
| EB_BL_SG1  | L   | L   | H   | · · · | L   |
| EB_BL_SG2  | L   | L   | H   | · · · | L   |
| EB_BL_SG3  | L   | L   | H   | · · · | L   |
| ⋮          | ⋮   | ⋮   | ⋮   | ⋮     | ⋮   |
| EB_BL_SGk  | L   | L   | H   | · · · | L   |

SEMICONDUCTOR MEMORY DEVICES, MEMORY SYSTEMS AND METHODS OF OPERATING SEMICONDUCTOR MEMORY DEVICES

CROSS-REFERENCE TO RELATED APPLICATION

Korean Patent Application No. 10-2017-0145251, filed on Nov. 2, 2017, and entitled, "Semiconductor Memory Devices, Memory Systems and Methods of Operating Semiconductor Memory Devices," is incorporated by reference in its entirety.

BACKGROUND

1. Field

One or more embodiments herein relate to semiconductor memory devices.

2. Description of the Related Art

A variety of semiconductor memories have been developed. Non-volatile memories include flash memories. Volatile memories include dynamic random access memories (DRAMs). DRAMs are often used for system memories because of their high speed operation and cost efficiency. Efforts are continually being made to reduce the sizes of these devices. However, reducing size may increase bit errors and adversely affect yield.

SUMMARY

In accordance with one or more embodiments, a semiconductor memory device includes a memory cell array; an error injection register set to store an error bit set, including at least one error bit, based on a first command, the error bit set associated with a data set to be written in the memory cell array; a data input buffer to store the data set to be written in the memory cell array based on a second command; and a write data generator to generate a write data set to be written in the memory cell array based on the data set and the error bit set; and control logic to control the error injection register set and the data input buffer.

In accordance with one or more other embodiments, a memory system includes at least one semiconductor memory device; and a memory controller to control the at least one semiconductor memory device, wherein the at least one semiconductor memory device includes: a memory cell array; an error injection register set to store an error bit set, including at least one error bit, based on a first command from the memory controller, the error bit set associated with a data set to be written in the memory cell array; a data input buffer to store the data set to be written in the memory cell array based on a second command from the memory controller; and a write data generator to generate a write data set to be written in the memory cell array based on the data set and the error bit set; and control logic to control the error injection register set and the data input buffer.

In accordance with one or more other embodiments, a method of operating a semiconductor memory device including a memory cell array includes writing an error bit set, including at least one error bit, in an error injection register set based on a first command from a memory controller, the error bit set associated with a data set to be written in the memory cell array; storing the data set to be written in the memory cell array in a data input buffer based on a second command from the memory controller; generating a write data set based on the data set and the error bit set; writing the write data set in a memory location designated by a target address; and reading the write data set from the memory location, based on a read command from the memory controller, and transmitting the read write data set as a read data set to the memory controller.

BRIEF DESCRIPTION OF THE DRAWINGS

Features will become apparent to those of ordinary skill in the art by describing in detail exemplary embodiments with reference to the attached drawings in which:

FIG. 6 illustrates an embodiment of second data bits that may be stored in the error injection register set;
FIGS. 7 to 9 illustrate examples of error patterns.

DETAILED DESCRIPTION

Figure 1:
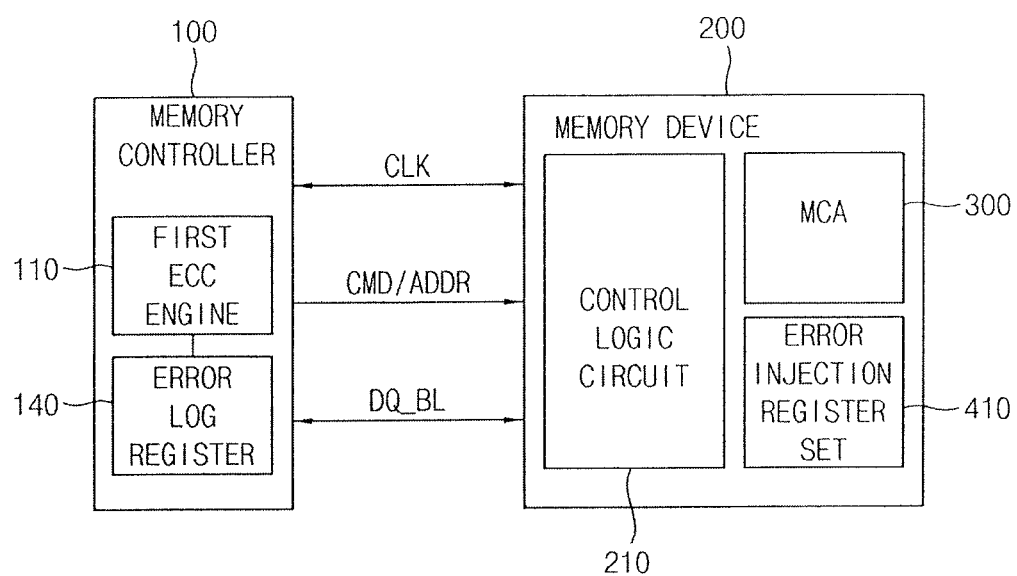
FIG. 1 illustrates an embodiment of a memory system.

FIG. 1 illustrates an embodiment of a memory system 20 which may include a memory controller 100 and a semiconductor memory device 200. The memory controller 100 may control overall operation of the memory system 20. The memory controller 100 may control overall data exchange between an external host and the semiconductor memory device 200. For example, the memory controller 100 may write data in the semiconductor memory device 200 and/or read data from the semiconductor memory device 200 based on request from the host. In addition, the memory controller 100 may issue operation commands to the semiconductor memory device 200 for controlling the semiconductor memory device 200.

The semiconductor memory device 200 may include, for example, dynamic memory cells, and thus may be a dynamic random access memory (DRAM), double data rate 4 (DDR4) synchronous DRAM (SDRAM), or a low power DDR4 (LPDDR4) SDRAM.

The memory controller 100 transmits a clock signal CLK, a command CMD and an address (signal) ADDR to the semiconductor memory device 200 and exchanges data set DQ_BL with the semiconductor memory device 200.

The memory controller 100 may include a first error correction code (ECC) engine 110 and error log register 140. The first ECC engine 110 may perform ECC decoding on the data set DQ_BL provided from the semiconductor memory device 200. The error log register 140 may log error information of the data set DQ_BL provided from the semiconductor memory device 200 therein.

The semiconductor memory device 200 includes a memory cell array 300, an error injection register set 410, and a control logic circuit 210. The memory cell array 300 may store the data set DQ_BL. The error injection register set 410 may store an error bit set including at least one error bit associated with the data set DQ_BL to be stored in the memory cell array 300. The control logic circuit 210 may control access to the memory cell array 300 based on the command CMD and the address ADDR. In addition, the control logic circuit 210 may set at least one error bit in the error injection register set 410 to one of a plurality of error patterns based on the command CMD.

Figure 2:
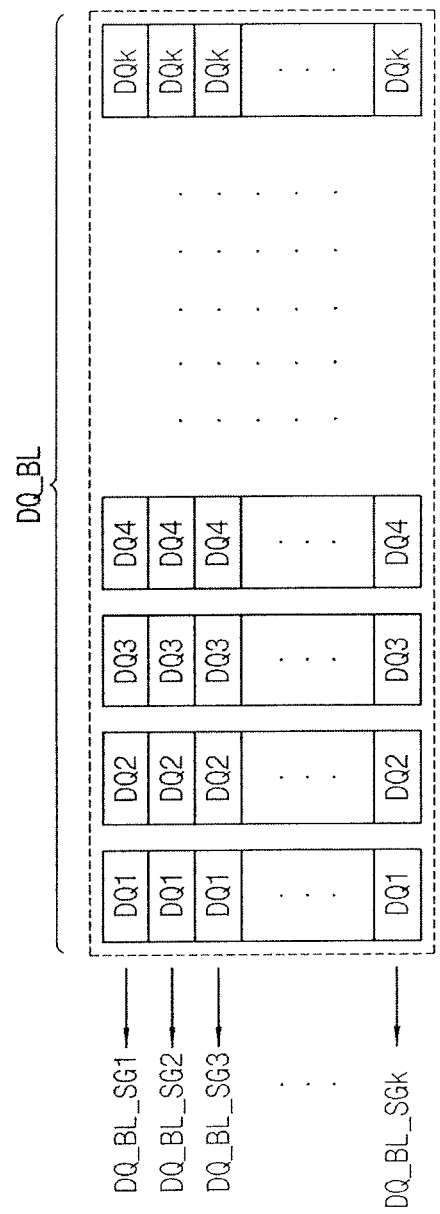
FIG. 2 illustrates an embodiment of a data set corresponding to burst lengths.

FIG. 2 illustrates an embodiment of the data set DQ_BL, which may correspond to a plurality of burst lengths in the memory system of FIG. 1. Referring to FIG. 2, the data set DQ_BL is input to/output from the semiconductor memory device 200. The data set DQ_BL may include data segments DQ_BL_SG1~DQ_BL_SGk, each corresponding to respective ones of the plurality of burst lengths. The burst length is assumed to be 8 or 16 in FIG. 2, but may be a different value in another embodiment. The data set DQ_BL corresponding to the plurality of burst lengths may be stored in the memory cell array 300 of the semiconductor memory device 200.

Figure 3:
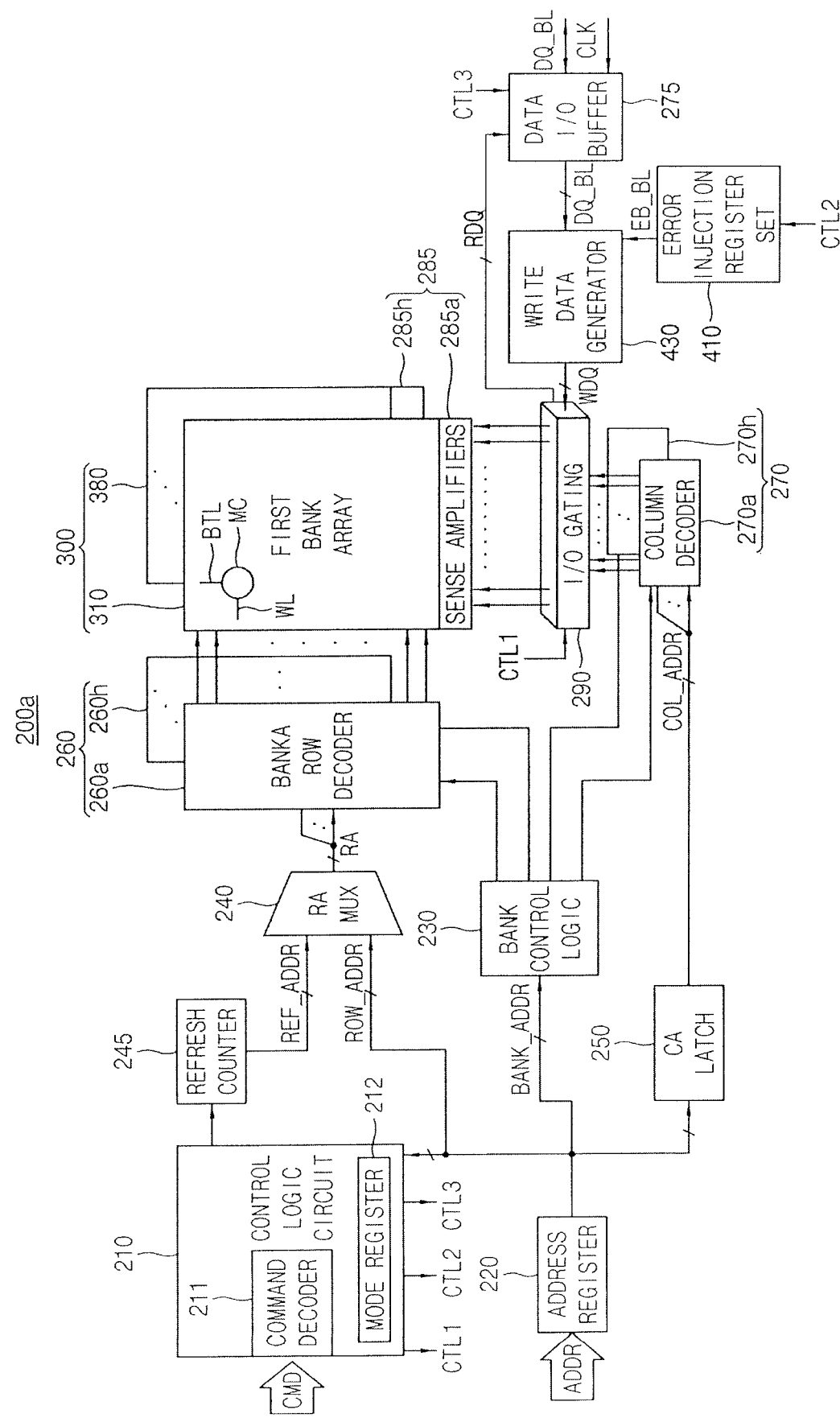
FIG. 3 illustrates an embodiment of a semiconductor memory device.

FIG. 3 illustrates an embodiment of a semiconductor memory device 200a, which, for example, may be in the memory system of FIG. 1. Referring to FIG. 3, the semiconductor memory device 200a includes a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit block 290, a data input/output (I/O) buffer 275, a refresh counter 245, an error injection register set 410, and a write data generator 430.

The I/O gating circuit block 290 includes a plurality of I/O gating circuits corresponding to a plurality of bank arrays 310~380 in the memory cell array 300.

The memory cell array 300 includes first to eighth bank arrays 310~380. The row decoder 260 includes first to eighth bank row decoders 260a~260h respectively coupled to the first to eighth bank arrays 310~380. The column decoder 270 includes first to eighth bank column decoders 270a~270h respectively coupled to the first to eighth bank arrays 310~380. The sense amplifier unit 285 includes first to eighth bank sense amplifiers 285a~285h respectively coupled to the first to eighth bank arrays 310~380. The first to eighth bank arrays 310~380, the first to eighth bank row decoders 260a~260h, the first to eighth bank column decoders 270a~270h, and first to eighth bank sense amplifiers 285a~285h may form first to eighth banks. Each of the first to eighth bank arrays 310~380 may include a plurality of memory cells MC coupled to word-lines WL and bit-lines BTL.

The address register 220 receives an address ADDR including a bank address BANK_ADDR, a row address ROW_ADDR, a column address COL_ADDR, and the command CMD from the memory controller 100. The address register 220 may provide the received bank address BANK_ADDR to the bank control logic 230, the received row address ROW_ADDR to the row address multiplexer 240, and the received column address COL_ADDR to the column address latch 250.

The bank control logic 230 may generate bank control signals based on the bank address BANK_ADDR. One of the first to eighth bank row decoders 260a~260h corresponding to the bank address BANK_ADDR may be activated based on the bank control signals. One of the first through eighth bank column decoders 270a~270h corresponding to the bank address BANK_ADDR may be activated based on the bank control signals.

The row address multiplexer 240 may receive the row address ROW_ADDR from the address register 220, and may receive a refresh row address REF_ADDR from the refresh counter 245. The row address multiplexer 240 may selectively output one of the row address ROW_ADDR the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220 and temporarily store the column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first to eighth bank column decoders 270a~270h, by the bank control logic 230, may decode the column address COL_ADDR output from the column address latch 250, and may control the input/output gating circuit in order to output data corresponding to the column address COL_ADDR.

Each of the I/O gating circuits in the I/O gating circuit block 290 includes a circuitry for gating input/output data. Each of the I/O gating circuits in the I/O gating circuit block 290 may further include read data latches for storing data output from the first to eighth bank arrays 310~380, and write drivers for writing data to the first to eighth bank arrays 310~380.

A data set to be read from one bank array of the first to eighth bank arrays 310~380 may be sensed by a sense amplifier coupled to the one bank array from which the data is to be read, and may be stored in the read data latches. The data set stored in the read data latches may be provided to the memory controller 30 via the data I/O buffer 275.

Data set DQ_BL to be written in one bank array of the first to eighth bank arrays 310~380 may be provided to the write data generator 430 from the data I/O buffer 275 based on a third control signal CTL3. The data DQ_BL are provided to the error correction circuit 400. Error bit set EB_BL associated with the data set DQ_BL to be written in one bank array may be stored in the error injection register set 410 based on a second control signal CTL2, and may be provided to the write data generator 430 under the control of the control logic circuit 210.

The write data generator 430 may generate a write data set WDQ based on the data set DQ_BL and the error bit set EB_BL and may provide the write data set WDQ to a corresponding I/O gating circuit in the I/O gating circuit block 290.

In a write operation, the data I/O buffer 275 may provide the write data generator 430 with the data set DQ_BL from the memory controller 100 based on the clock signal CLK. In a read operation, the data I/O buffer 275 may provide the memory controller 100 with the data set DQ_BL from the I/O gating circuit block 290.

The control logic circuit 210 may control operations of the semiconductor memory device 200. For example, the control logic circuit 210 may generate control signals for the semiconductor memory device 200a in order to perform a write operation or a read operation. The control logic circuit 210 may include a command decoder 211 that decodes the command CMD from the memory controller 100 and a mode register 212 that sets an operation mode of the semiconductor memory device 200a.

For example, the command decoder 211 may generate the control signals corresponding to the command CMD by decoding a write enable signal, a row address strobe signal, a column address strobe signal, a chip select signal, and/or another signal. The control logic circuit 210 may generate a first control signal CTL1 to control the I/O gating circuit block 290, a second control signal CTL2 to control the error injection register set 410, and a third control signal CTL3 to control the data I/O buffer 275.

The control logic circuit 210 may set at least one error bit associated with the write data set to be written in a memory location designated by a target address ADDR. This may be accomplished, for example, by changing the logic level of at least one of the second data bits stored in the error inject register set 410.

Figure 4:
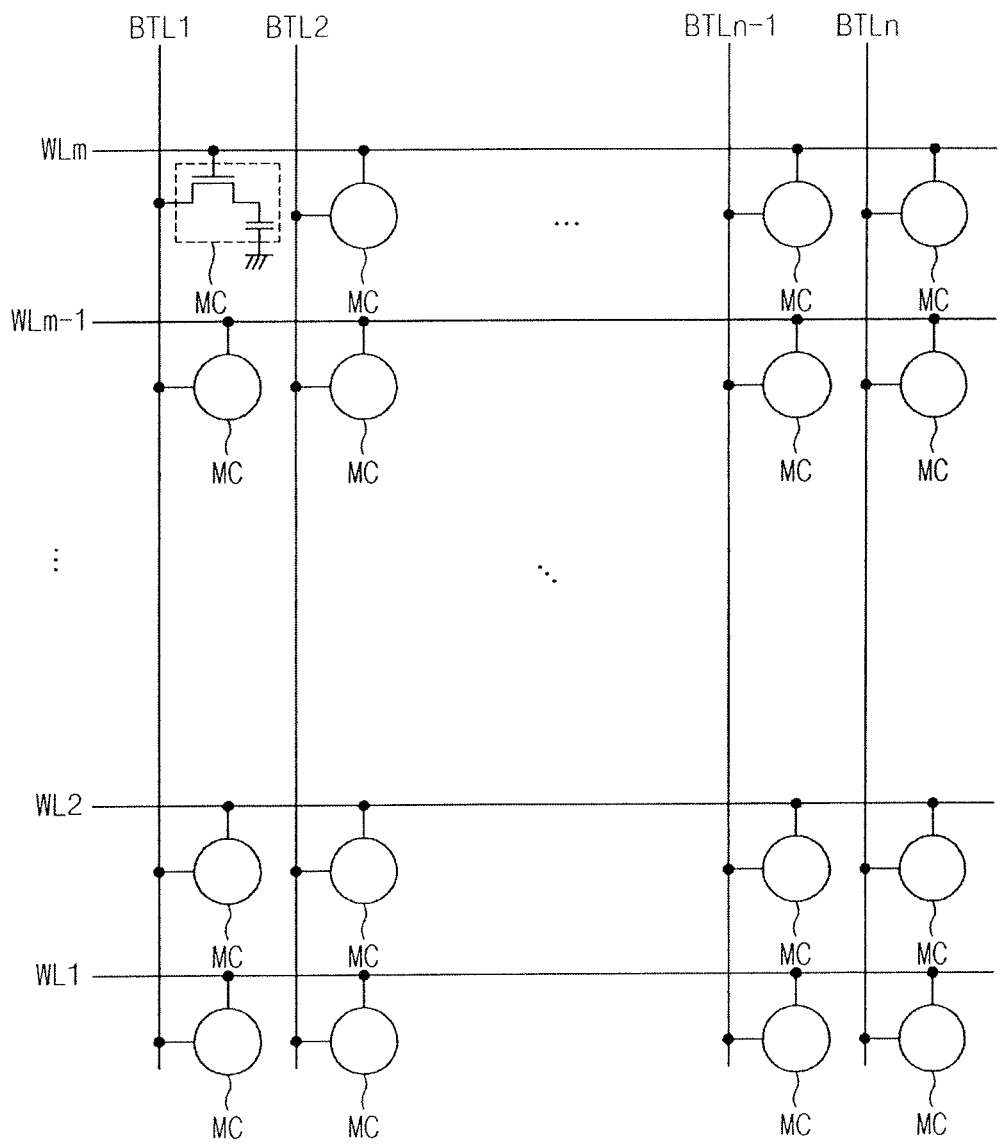
FIG. 4 illustrates an embodiment of a first bank array.

FIG. 4 illustrates an embodiment of the first bank array 310 in the semiconductor memory device of FIG. 3. Referring to FIG. 4, the first bank array 310 a plurality of word-lines WL1~WLm (m is a natural number greater than two), a plurality of bit-lines BTL1~BTLn (n is a natural number greater than two), and a plurality of memory cells MCs at intersections between the word-lines WL1~WLm and the bit-lines BTL1~BTLn. Each of the memory cells MCs includes a cell transistor coupled to respective ones of the word-lines WL1~WLm and respective ones of the bit-lines BTL1~BTLn, and a cell capacitor coupled to the cell transistor.

Figure 5:
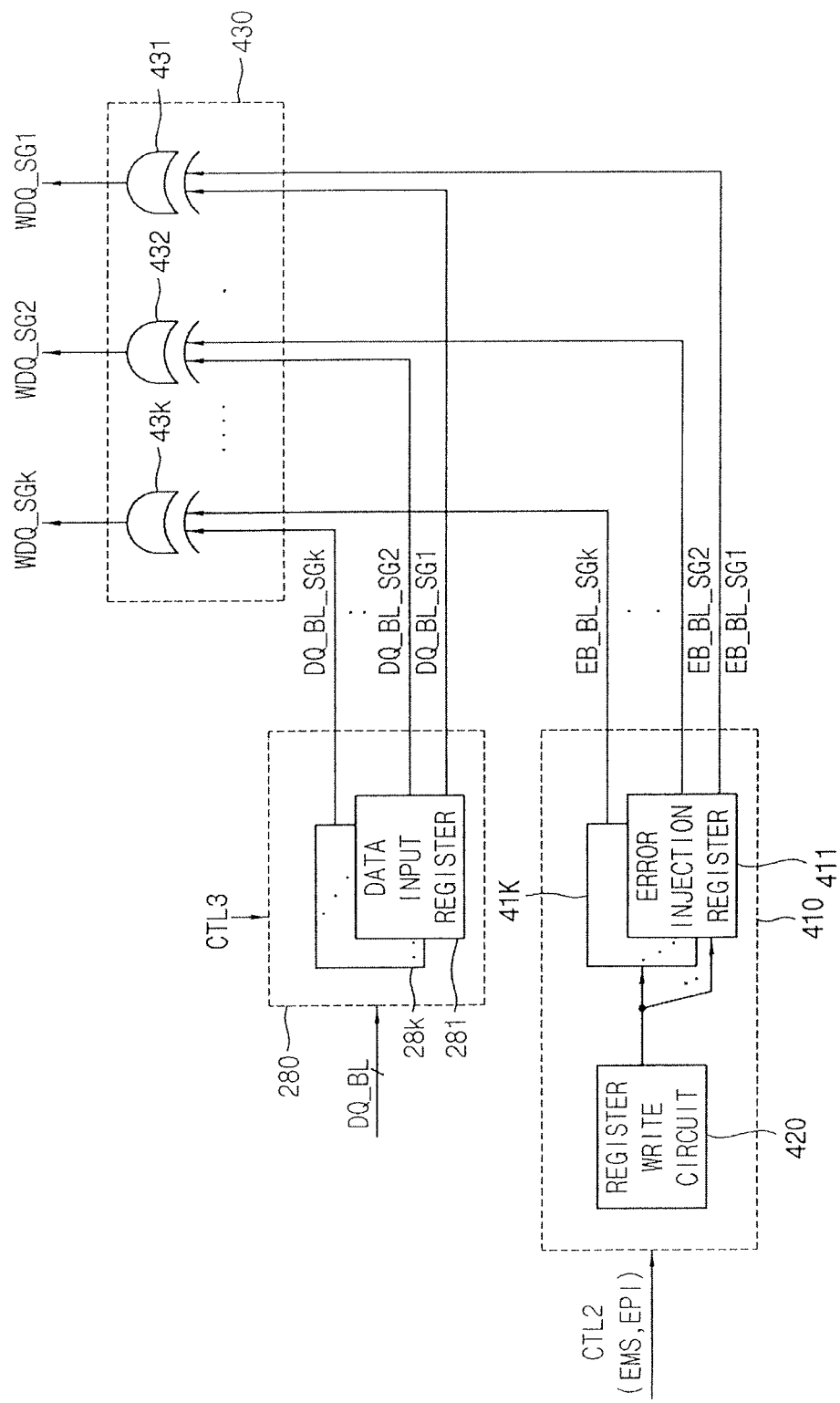
FIG. 5 illustrates an embodiment which includes an error injection register set, a data I/O buffer, and the a data generator.

FIG. 5 illustrates an embodiment of the error injection register set 410, the data I/O buffer 275, and the write data generator 430 in the semiconductor memory device of FIG. 3. Referring to FIG. 5, the error injection register set 410 may include a register write circuit 420 and a plurality of error injection registers 411~41k. A data input buffer 280 may be included in the data I/O buffer 275 in FIG. 3. The data input buffer 280 may include a plurality of data input registers 281~28k. Each of the data input registers 281~28k may store a corresponding one of first units of first data bits DQ_BL_SG1~DQ_BL_SGk, corresponding to a burst length of the semiconductor memory device 200, in the data set DQ_BL. Each of the data input registers 281~28k may provide the write data generator 430 with a corresponding one of first units of first data bits DQ_BL_SG1~DQ_BL_SGk in the data set DQ_BL based on the third control signal CTL3.

Each of the error injection registers 411~41k may store a corresponding one of second units of second data bits EB_BL_SG1~EB_BL_SGk, which correspond to respective ones of the data input registers 281~28k and respective ones of the first units of first data bits DQ_BL_SG1~DQ_BL_SGk. The size of the first unit may be the same as a size of the second unit, or may be different in another embodiment.

The register write circuit 420 may maintain the second data bits stored in the error injection registers 411~41k at a default level (e.g., a first logic level, which, for example, may be a logic low level) based on an error mode signal EMS and error bit position information EPI in the second control signal CTL2, or may change at least one of the second data bits to a second logic level, designated by the error bit position information EPI.

When the error mode signal EMS indicates a normal mode, the register write circuit 420 maintains the second data bits stored in the error injection registers 411~41k at the default level. When the error mode signal EMS indicates an error injection mode, the register write circuit 420 changes at least one of the second data bits stored in the error injection registers 411~41k to a second logic level, which is designated by the error bit position information EPI.

The write data generator 430 may include a plurality of exclusive OR gates 431~43k. The plurality of exclusive OR gates 431~43k may perform an exclusive OR operation on corresponding data bits of the first units of first data bits DQ_BL_SG1~DQ_BL_SGk and corresponding data bits of the second units of second data bits EB_BL_SG1~EB_BL_SGk to generate write data set WDQ_SG1~WDQ_SGk. The write data set WDQ_SG1~WDQ_SGk may be written in a memory location designated by the target address ADDR via a corresponding I/O gating circuit.

FIG. 6 illustrates an example of second data bits that may be stored in the error injection register set in FIG. 5. Referring to FIG. 6, second data bits V having a first logic level as a default logic level may be stored in the error injection registers 411~41k in the error injection register set 410. The register write circuit 420 may change at least one of the second data bits V to a second logic level based on the error mode signal EMS and the error bit position information EPI in the second control signal CTL2, such that the write data set WDQ_SG1~WDQ_SGk representing various error patterns may be stored in a target memory location in the memory cell array 300.

The semiconductor memory device 200 reads the write data set WDQ_SG1~WDQ_SGk stored in the target memory location based on a read command from the memory controller 100 and may transmit the read write data set WDQ_SG1~WDQ_SGk to the memory controller 100 as a read data set.

The memory controller 100 may analyze error pattern of the read write data set WDQ_SG1~WDQ_SGk to determine whether the memory cell array 300 includes at least one defective cell. The memory controller 100 may log error information of the defective cell in the memory cell array 300 in the error log register 140. The first FCC engine 110 may perform an ECC decoding on the data set WDQ_SG1~WDQ_SGk (including the at least one error bit) to determine whether the at least one error bit is corrected. Thus, the first ECC engine 110 may evaluate the performance (e.g., capability) of the ECC at a system level. The semiconductor memory device 200 may therefore reduce costs because the semiconductor memory device 200 confirms responses to various error patterns without having to include an extra error injection card inserted into the semiconductor memory device 200.

FIGS. 7 to 9 illustrate examples of various error patterns which the error injection register set may represent. FIG. 7 illustrates a single bit error. Referring to FIG. 7, only one of the second data bits EB_BL_SG1~EB_BL_SGk has a logic high level. Therefore, the error pattern of FIG. 7 may represent a single bit error.

FIG. 8 illustrates a double bit error. Referring to FIG. 8, two of the second data bits EB_BL_SG1~EB_BL_SGk have a logic high level. Therefore, the error pattern of FIG. 8 may represent a double bit error.

FIG. 9 illustrates an error pattern associated with a data pad. Referring to FIG. 9, all data bits associated with a data pad DQ1 of the second data bits EB_BL_SG1~EB_BL_SGk have a logic high level. Therefore, the error pattern of FIG. 9 may represent an error pattern associated with a data pad. In addition, the error injection register set of FIG. 6 may represent various error patterns such as but not limited to a symbol error pattern.

Figure 10:
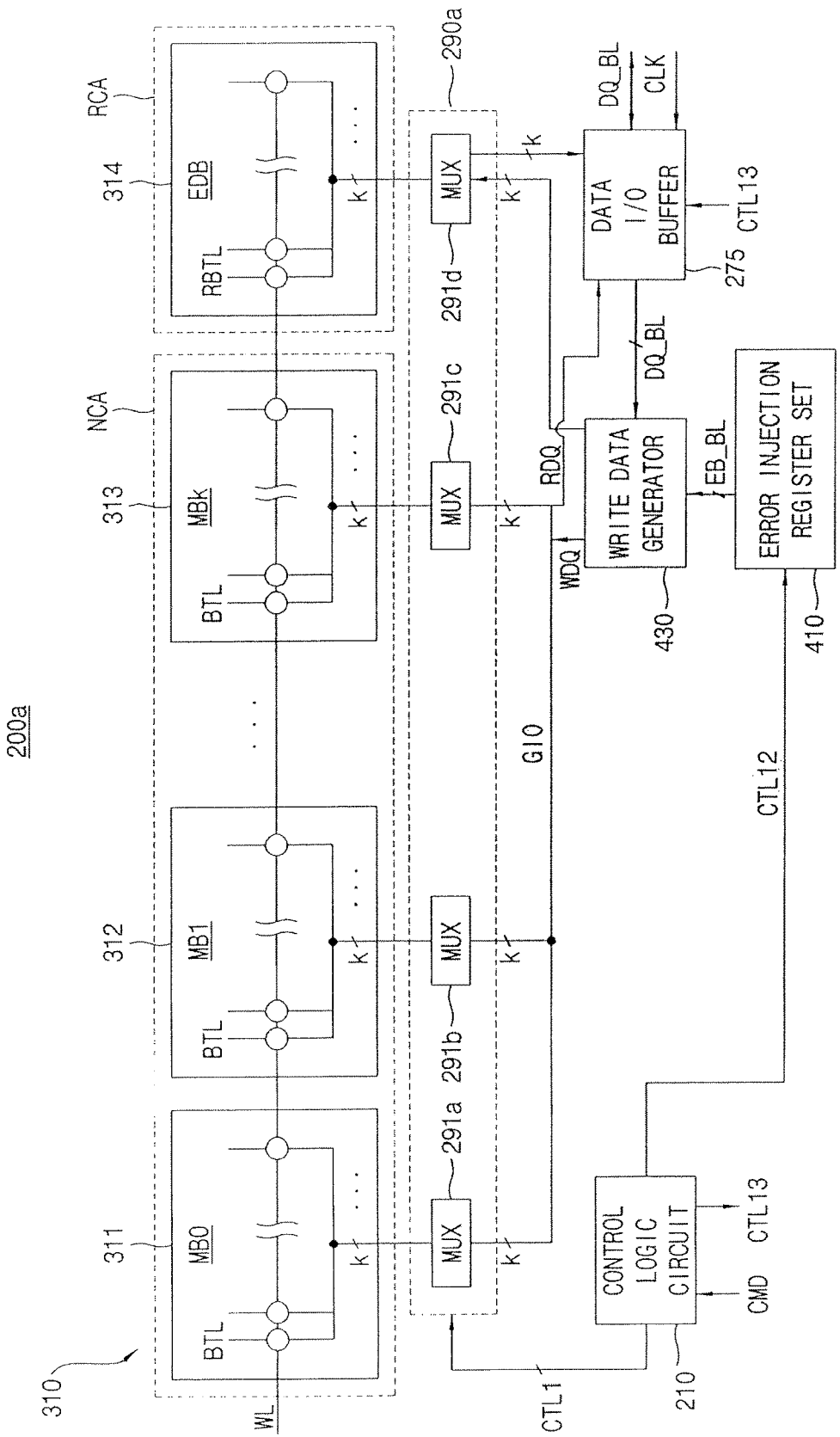
FIG. 10 illustrates an of a semiconductor memory device in error injection mode.

FIG. 10 illustrates another embodiment of a semiconductor memory device of FIG. 3 in an error injection mode. In FIG. 10, the semiconductor memory device 200a includes the control logic circuit 210, the first bank array 310, an I/O gating circuit 290a, the data I/O buffer 275, the error injection register set 410, and the write data generator 430.

Referring to FIG. 10, the first bank array 310 may include a normal cell array NCA and a redundancy cell array RCA. The normal cell array NCA may include a plurality of first memory blocks MB0~MB15 (e.g., 311~313). The redundancy cell array RCA may include at least a second memory block 314. The first memory blocks 311~313 may be used to determine a memory capacity of the semiconductor memory device 200a. The second memory block 314 may be used for ECC and/or redundancy repair. Since the second memory block 314 for ECC and/or redundancy repair is used for ECC, data line repair, and block repair to repair 'fail' cells generated in the first memory blocks 311~313, the second memory block 314 may also be referred to as an EDB block.

A plurality of first memory cells are arrayed in rows and columns in each of the first memory blocks 311~313. A plurality of second memory cells are arrayed in rows and columns in the second memory block 314.

In the first memory blocks 311~313, rows may be formed, for example, of 8K word-lines WL and columns may be formed, for example, of 1K bit-lines BTL. The first memory cells connected to intersections of the word-lines WL and the bit-lines BTL may be dynamic memory cells. In the second memory block 314, rows may be formed, for example, of 8K word-lines WL and columns may be formed, for example, of 1K bit-lines RBTL. The second memory cells connected to intersections of the word-lines WL and the bit-lines RBTL may be dynamic memory cells. The numbers of word-lines WL and/or bit-lines BTL may be different in another embodiment.

The I/O gating circuit 290a includes a plurality of switching circuit 291a~291d respectively connected to the first memory blocks 311~313 and the second memory block 314. In the semiconductor memory device 200a, bit lines corresponding to data of a burst length (BL) may be simultaneously accessed to support the BL indicating the maximum number of column positions that is accessible, e.g., when the BL is set to k (k may be 8 or 16). The bit-lines BTL may be connected to each of column selection units coupled to column selections signals, and k bit-lines may be simultaneously selected by one column selection unit.

The write data generator 430 may be connected to the switching circuits 291a~291d through first data lines GIO and second data lines. The data I/O buffer 275 may be connected to the switching circuits 291a~291d through the first data lines GIO and the second data lines.

The control logic circuit 210 may decode the command CMD to generate a first control signal CTL11 for controlling the switching circuits 291a~291, a second control signal CTL2 for controlling the error inject register set 410, and a third control signal CTL13 for controlling the data I/O buffer 275.

When the command CMD corresponds to a first command designating an error injection mode, the control logic circuit 210 applies the first control signal CTL11 to the I/O gating circuit 290a to turn-off the switching circuit 291d. Also, the control logic circuit 210 cuts off a connection of the second memory block 314 to the write data generator 430 and the data I/O buffer 275 to disable a repair function of the semiconductor memory device 200a. In addition, in the error injection mode, the switching circuits 291a~291c connects the first memory blocks 311, 312 and 313 to the write data generator 430 and the data I/O buffer 275 based on the first control signal CTL11, such that the write data set WDQ including at least one error bit may be stored in the first memory blocks 311, 312, and 313 and the read data set RQD including at least one error bit may be read from the first memory blocks 311, 312 and 313.

Figure 11:
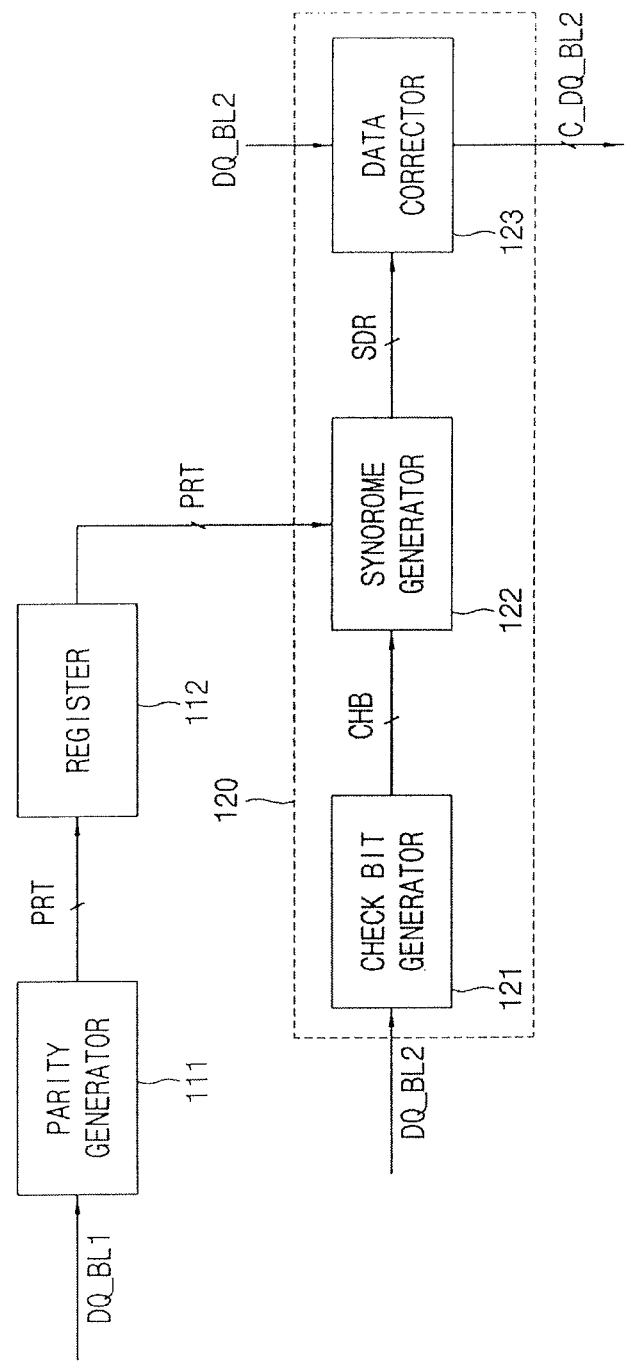
FIG. 11 illustrates an embodiment of a error correction code (ECC) engine.

FIG. 11 illustrates an embodiment of the first ECC engine 110 in the memory controller in FIG. 1. Referring to FIG. 11, the first ECC engine 110 may include a parity generator 111, a register 112, and an ECC decoder 120. The ECC decoder 120 may include a check bit generator 121, a syndrome generator 122, and a data corrector 123.

The parity generator 111 may generate parity bits PRT based on data set (write data set) DQ_BL1 to be provided to the semiconductor memory device 200 and may store the parity bits PRT in the register 112.

The check bit generator 121 may generate check bits CHB based on data set (read data set) DQ_BL2 read from the semiconductor memory device 200. The syndrome generator 122 may generate syndrome data SDR indicating a number of error bits and the position of error bits based on the check bits CHB and the parity bits PRT from the register 112. The data corrector 123 may correct at least one error bit in the read data set DQ_BL2 and output corrected data set C_DQ_BL.

Since, in the error injection mode of the semiconductor memory device 200, the read data set DQ_BL2 includes at least one error bit, error correction capability of the ECC encoder 120 may be evaluated (verified).

Figure 12:
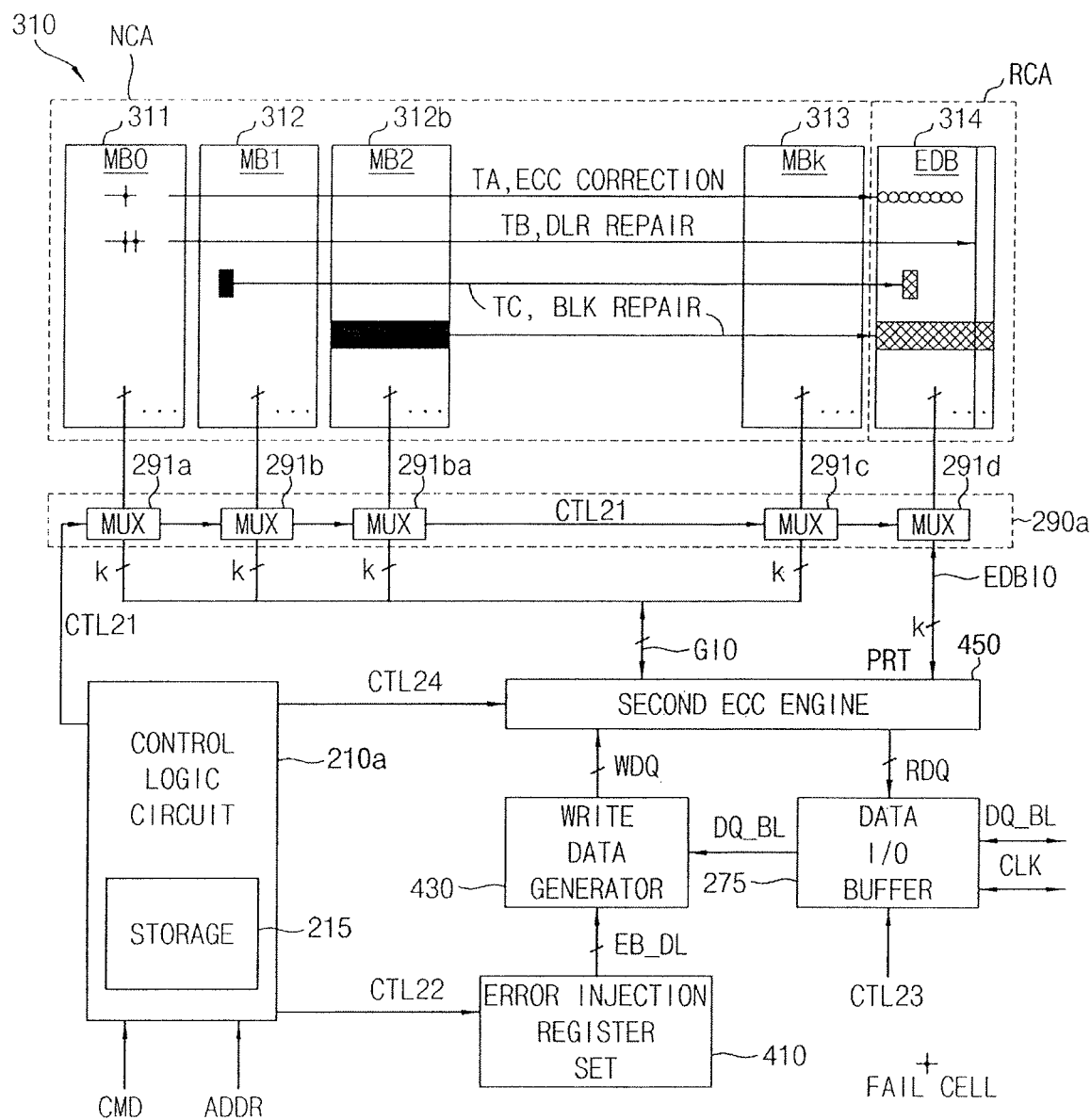
FIG. 12 illustrates another embodiment of a semiconductor memory device.

FIG. 12 illustrates another embodiment of a semiconductor memory device of FIG. 3. The semiconductor memory device 200b of FIG. 12 differs from the semiconductor memory device 200a of FIG. 10 in that the semiconductor memory device 200b further includes a second ECC engine 450 and a control logic circuit 210a includes a fail address storage 215. The second ECC engine 450 may share ECC operation and a redundancy repair operation.

Advancements in semiconductor manufacturing technology have led to an increase in the memory capacity of a DRAM device. As microfabrication process technology has advanced, the number of defective memory cells has increased. 'Fail' memory cells may include defective cells and weak cells. The defective cells are hardware-defective, e.g., the defective cells are memory cells that do not operate due to a defect in a manufacturing process (e.g., memory cells having a wiring disconnection or short). The weak cells are software-defective, e.g., the weak cells are memory cells that are defective under a specific voltage condition or specific operation timing. Examples of weak cells may include cells that deteriorate in terms of their characteristics, e.g., a cell having a short refresh duration, a cell having a degraded cell write performance or a variable retention time, or a cell having another defect. To secure manufacturing yield, 'fail' memory cells are repaired by replacing them with redundant memory cells.

Data stored in the first memory blocks 311, 312, 312b, and 313 may be input and output via corresponding data I/O pads.

The control logic circuit 210a includes a fail address storage 215 that stores fail addresses addressing 'fail' memory cells in the semiconductor memory device 200b. The fail address storage 215 may store fail addresses occurring during testing of the semiconductor memory device 200b. In addition, the fail address storage 215 may store fail addresses newly occurring while the semiconductor memory device 200b operates in a system mounted therewith. The fail address storage 215 may update fail addresses stored therein to store additionally occurring fail addresses. The fail address storage 215 may be implemented, for example, with an anti-fuse array, a content addressable memory (CAM), a register, or a memory device such as a static random access memory (SRAM).

Fail addresses stored in the fail address storage 215 may be classified, for example, based on types of fails according to error bits in data that read from the normal cell array NCA. In the first memory blocks 311, 312, 312b, and 313 in the normal cell array NCA, data may be read from memory cells per one unit. In each of the first memory blocks 311, 312, 312b, and 313, bit-lines corresponding to a burst length (BL) may be simultaneously accessed to support the BL indicating the maximum number of column locations that is accessible.

The k parity bits PRT may be used for an ECC operation to detect at least one error bit with respect to data bits stored in the first memory blocks 311, 312, 312b, and 313 and to correct a detected error bit. Bits obtained by adding the data bits and the k parity bits PRT may be referred to as a 'codeword'. The k parity bits PRT may be stored in the second memory block 314 in the redundancy cell array RCA. The redundancy cell array RCA may also be referred to as a parity cell region.

Fails corresponding to fail addresses stored in the fail address storage 215 may be classified into a type in which the number of error bits in one codeword is one, a type in which the number of error bits in one codeword is two, and a type in which the number of error bits in one codeword is three or more. The type in which the number of error bits in one codeword is three or more may be regarded as a block fail. In an exemplary embodiment, when the number of error bits in one codeword is one, the second memory block 314 is used for ECC (e.g., refer to TA of FIG. 12). When the number of error bits in one codeword is two or more, 'fail' cells may not be able to be repaired by an ECC operation. Thus, in one embodiment, when the number of error bits in one codeword is two, the second memory block 314 is used for data line repair (e.g., refer to TB of FIG. 12). When the number of error bits in one codeword is three or more (e.g., when a block fail occurs), the second memory block 314 is used for block repair (e.g., refer to TC of FIG. 12).

The control logic circuit 210a determines whether the address ADDR applied from the memory controller 100 is the same as a fail address stored in the fail address storage 215. The control logic circuit 210a compares fail addresses (which are stored in the fail address storage 215 according to types of fail cells, e.g., a single-bit error in one codeword, a two-bit error in one codeword, and a three or more-bit error in one codeword (e.g., a block fail)) to the address ADDR applied from the memory controller 100. The control logic circuit 201a then generates a first control signal CTL21 and a fourth control signal CTL24 according to the comparison result. The control logic circuit 210 may also generate a second control signal CTL22 to control the error injection register set 410 and a third control signal CTL23 to control the data I/O buffer 275.

The control logic circuit 210a provides the first control signal CTL21 to the switching circuits 291a, 291b, 291ba, 291c, and 291d and provides the fourth control signal CTL24 to the second ECC engine 450. The first control signal CTL21 and the fourth control signal CTL24 control the switching circuits 291a, 291b, 291ba, 291c, and 291d and the second ECC engine 450 to selectively perform an ECC operation or a redundancy repair operation according to types of 'fail' cells occurring in the normal cell array NCA. The switching circuits 291a, 291b, 291ba, 291c, and 291d are connected to the second ECC engine 450 through first data lines GIO and second data lines EDBIO.

The memory controller 100 applies a first command CMD designating an error injection mode to the control logic circuit 210a for evaluating a redundancy repair function (a repair on system function), and may set the mode register 212 to disable an ECC operation and/or a redundancy repair operation of the semiconductor memory device 200b. In this case, the control logic circuit 210a generates the first control signal CTL21 and the fourth control signal CTL24 to disable ECC operation and/or a redundancy repair operation of a corresponding word-line. Accordingly, the write data set WDQ including at least one error bit is written in the first memory blocks 311, 312, 312b, and 313 in a write operation. The read data set RDQ including the at least one error bit may be read from the first memory blocks 311, 312, 312b, and 313 and provided to the memory controller 100 via the data I/O buffer 275.

The memory controller 100 applies the first command CMD designating an error injection mode to the control logic circuit 210a, while setting the mode register 212 to enable an ECC operation and/or a redundancy repair operation of the semiconductor memory device 200b. In this case, the control logic circuit 210a generates the first control signal CTL21 and the fourth control signal CTL24 to enable an ECC operation and/or a redundancy repair operation of a corresponding word-line.

Accordingly, in a write operation, the write data set WDQ including at least one error bit is written in the first memory blocks 311, 312, 312b, and 313 after the ECC operation and/or the redundancy repair operation is performed on the write data set WDQ including the at least one error bit. The read data set RDQ including the at least one error bit may be read from the first memory blocks 311, 312, 312b, and 313 when the ECC operation and/or the redundancy repair operation is performed on the read data set RDQ, and may be provided to the memory controller 100 via the data I/O buffer 275.

The memory controller 100 compares the read data set RDQ (e.g., a first read data set) including the at least one error bit and the read data set RDQ (e.g., a second read data set) on which the ECC operation and/or the redundancy repair operation was performed, and evaluates a redundancy repair function of the semiconductor memory device 200b.

In an exemplary embodiment, the memory controller 100 applies the first command CMD designating the error injection mode to the control logic circuit 210a, while setting the mode register 212 to enable an ECC operation and to disable a redundancy repair operation. In this case, the second ECC engine 450 generates the parity bits PRT based on the write data set WDQ including the at least one error bit, and stores the parity bits PRT in the second memory block 314 through the switching circuit 291*d*.

In FIG. 12, the type in which the number of error bits in one codeword is one corresponds to the error pattern of FIG. 7. The type in which the number of error bits in one codeword is two corresponds to the error pattern of FIG. 8. The type in which the number of error bits in one codeword is three or more corresponds to the error pattern of FIG. 9.

Figure 13:
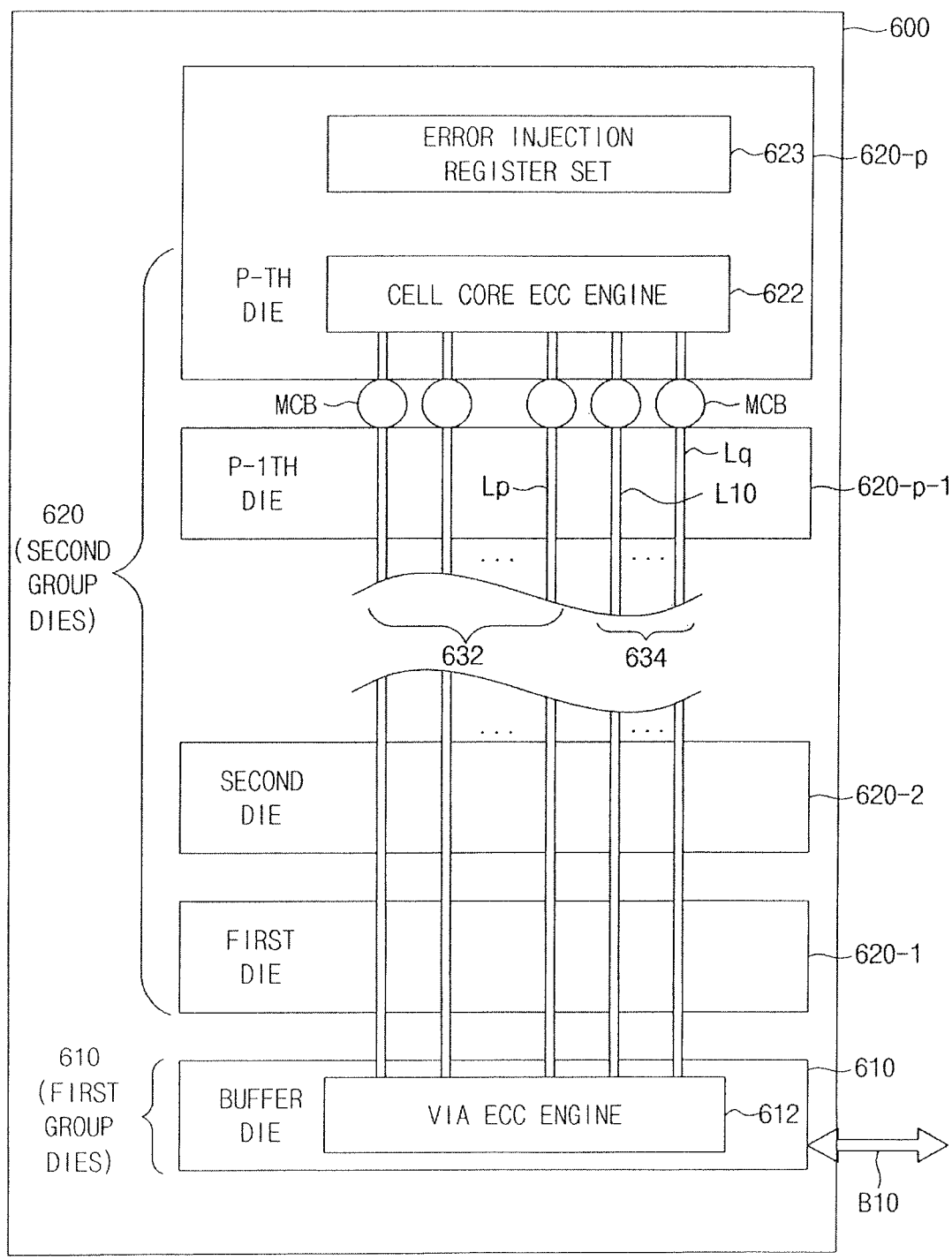
FIG. 13 illustrates another embodiment of a semiconductor memory device.

FIG. 13 illustrates another embodiment of a semiconductor memory device 600 which may include first group dies 610 and second group dies 620 used to perform a soft error analyzing and correcting function in a stacked chip structure.

The first group die 610 may include at least one buffer die. The second group dies 620 may include a plurality of memory dies 620-1 to 620-*p* stacked on the first group die 610 and conveying data through a plurality of through silicon via (TSV) lines. At least one of the memory dies 620-1 to 620-*p* may include a first type error correction code (ECC) engine 622, which generates transmission parity bits based on transmission data to be sent to the first group die 610 and an error injection register set 623. The first type ECC engine 622 may be referred to as 'cell core ECC engine'.

The buffer die 610 may include a second type ECC engine 612 which corrects a transmission error using the transmission parity bits, when a transmission error is detected from the transmission data received through the TSV liens, and generates error-corrected data. The second type ECC engine 612 may be referred to as 'via ECC engine'.

The semiconductor memory device 600 may be a stack chip type memory device or a stacked memory device which conveys data and control signals through the TSV lines. The TSV lines may be also called 'through electrodes'.

The first type ECC engine 622 may perform error correction on data output from the memory die 620-*p* before the transmission data is sent.

A transmission error which occurs at the transmission data may be caused by noise in the TSV lines. A data fail cased by noise in the TSV lines may be distinguishable from a data fail caused by a false operation of the memory die. Thus, a data fail caused by noise in the TSV lines may be regarded as soft data fail (or a soft error). A soft data fail may be generated, for example, by transmission fail on a transmission path and may be detected and remedied by an ECC operation. When, for example, the transmission data is 64-bit data, the transmission parity bits may be set to 8 bits. The number of transmission parity bits may be different in another embodiment.

With the above description, a TSV line group 632 at one memory die 620-*p* may include 64 TSV lines L1 to Lp and a parity TSV line group 634 may include 8 TSV lines L10 to Lq. The TSV lines L1 to Lp of the data TSV line group 632 and the parity TSV lines L10 to Lq of the parity TSV line group 634 may be connected to micro bumps MCB respectively formed among the memory dies 620-1 to 620-*p*. At least one of the memory dies 620-1 to 620-*n* may include DRAM cells, each including at least one access transistor and one storage capacitor.

The semiconductor memory device 200 may have a three-dimensional (3D) chip structure or a 2.5D chip structure to communicate with the host through a data bus B10. The buffer die 610 may be connected with the host through the data bus B10.

The first type ECC engine 622 (e.g., the cell core ECC engine) may output transmission parity bits and the transmission data through the parity TSV line group 634 and the data TSV line group 632, respectively. The output transmission data may be data which is error-corrected by the first type ECC engine 622.

The second type ECC engine 612 (e.g., the via ECC engine) may determine whether a transmission error occurs at the transmission data (received through the data TSV line group 632) based on the transmission parity bits (received through the parity TSV line group 634). When a transmission error is detected, the second type ECC engine 612 may correct the transmission error on the transmission data based on the transmission parity bits. When the transmission error is uncorrectable, the second type ECC engine 612 may output information indicating the occurrence of an uncorrectable data error. When an error is detected from read data in a high bandwidth memory (HBM) or the stacked memory structure, the error may be caused by noise while data is transmitted through the TSV.

According to exemplary embodiments, as illustrated in FIG. 13, the cell core ECC circuit 622 and the error injection register set 623 may be in the memory die, the via ECC engine 612 may be in the buffer die, and at least one error bit may be inserted in the memory cell of the memory die. Accordingly, it may be possible to detect and correct a soft data fail, which, for example, may include a transmission error caused by noise when data is transmitted through TSV lines.

Figure 14:
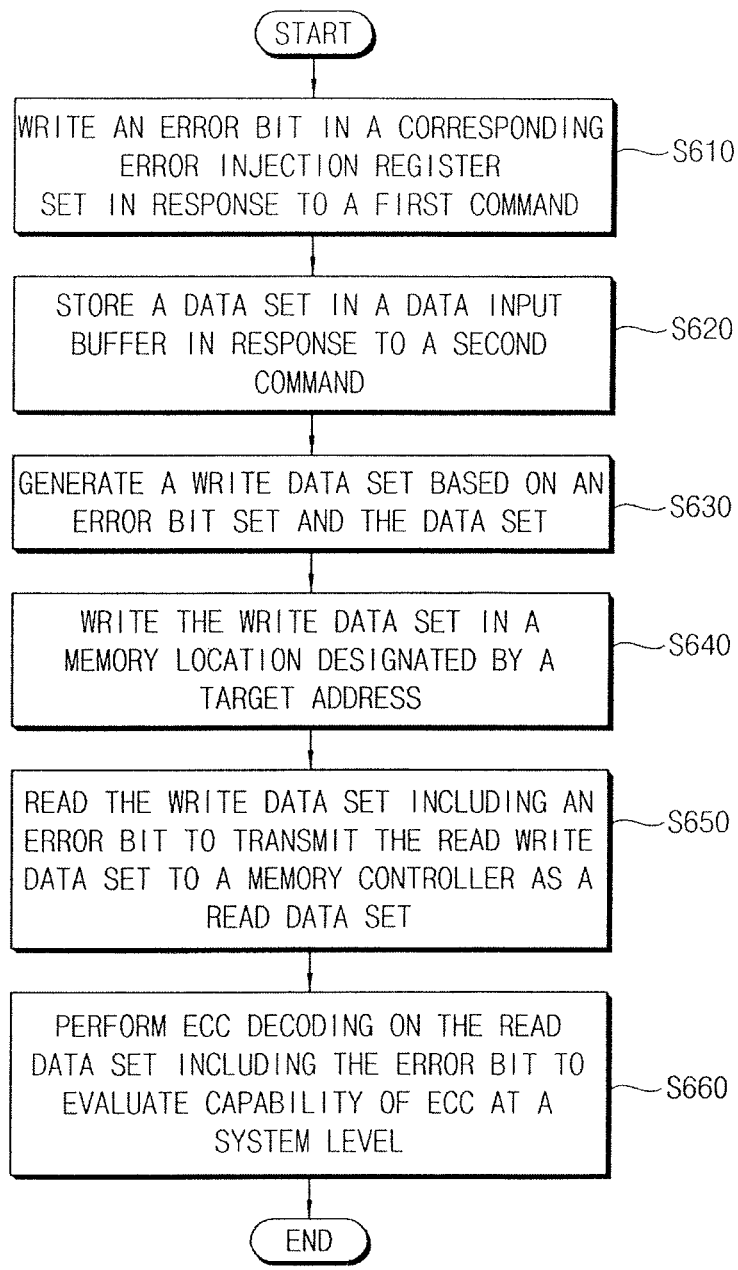
FIG. 14 illustrates an embodiment of a method for operating a semiconductor memory device.

FIG. 14 illustrates an embodiment of a method for operating a semiconductor memory device. Referring to FIGS. 1 to 12 and 14, for illustrative purposes, the method is discussed as operating semiconductor memory device 200 including a memory cell array 300. The method may also be applied to other embodiments described herein.

Referring to FIG. 14, the method includes writing an error bit set EB_BL, including at least one error bit, in an error injection register set 410 based on a first command from a memory controller 100 (S610). The error bit set EB_BL is associated with a data set DQ_BL to be written in the memory cell array 300. The data set DQ_BL to be written in the memory cell array 300 is stored in a data input buffer 280 based on a second command from the memory controller 100 (S620).

A write data set WDQ is generated based on the data set DQ_BL and the error bit set EB_BL by a write data generator 430 (S630). An I/O gating circuit 290*a* writes the write data set WDQ in a memory location designated by a target address ADDR (S640). The write data set WDQ including at least one error bit is read from the memory location based on a read command from the memory controller 100, and the write data set WDQ is transmitted to the memory controller 100 as a read data set RDQ (S650).

The memory controller 100 performs an ECC decoding on the read data set RDQ, including the at least one error bit, using the first ECC engine 110 to evaluate an error correction capability of the first ECC engine 110 at a system level (S660).

Figure 15:
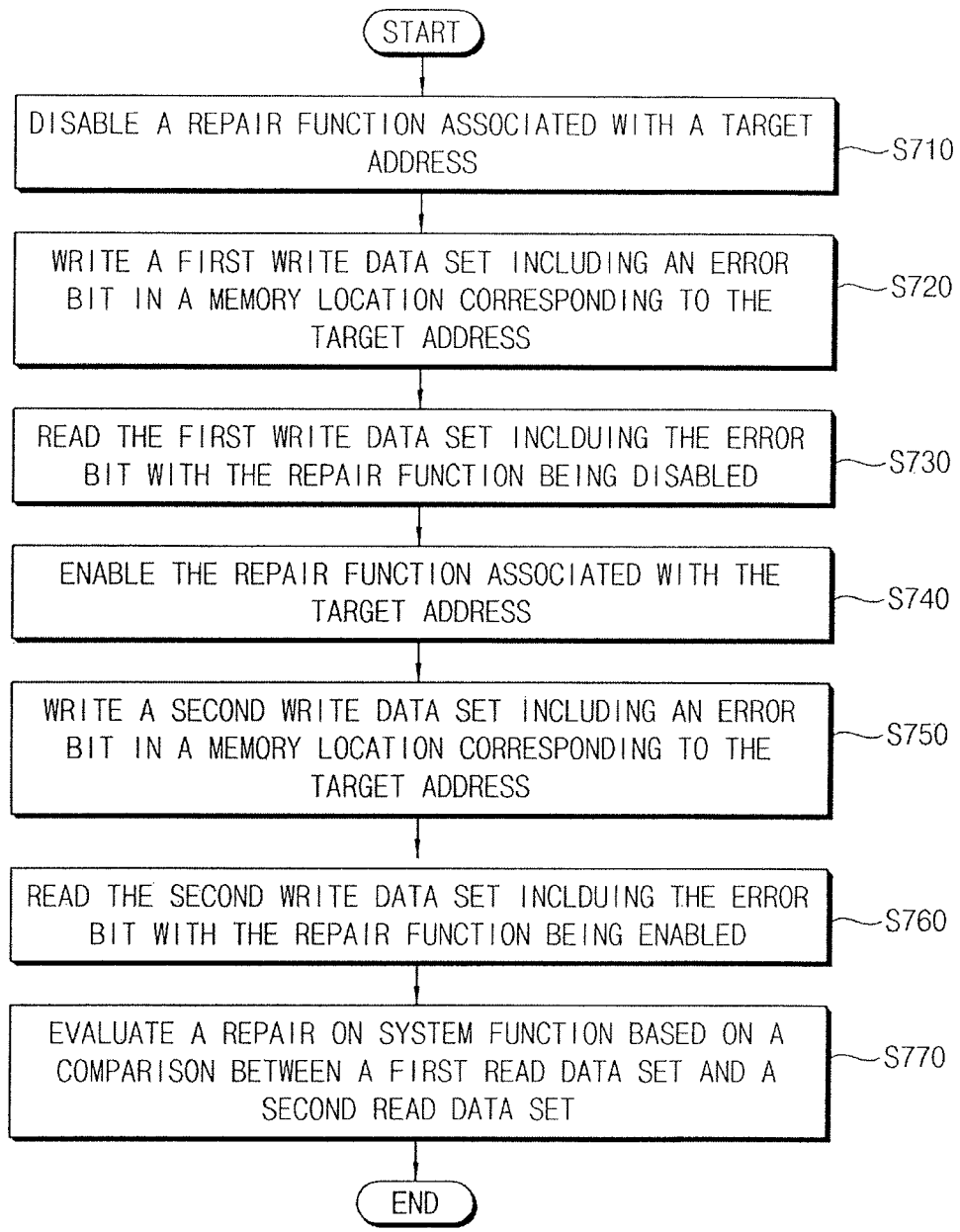
FIG. 15 illustrates another embodiment of a method for operating a semiconductor memory device.

FIG. 15 illustrates another embodiment of a method for operating a memory system. Referring to FIGS. 1 to 12 and 15, for illustrative purposes, the method is described as operating memory system 20 including a semiconductor memory device 200 and a memory controller 100 to control the semiconductor memory device 200. The method may also be applied to other embodiments described herein.

Referring to FIG. 15, the semiconductor memory device 200 receives a target address ADDR from the memory controller 100 and disables a redundancy repair function associated with the target address ADDR (S710). The semiconductor memory device 200 writes a first write data set, including at least one error bit, in a memory location corresponding to the target address ADDR in an error injection mode (S720).

The semiconductor memory device 200 reads the first write data set including the at least one error bit with the redundancy repair function disabled and transmits the read first write data set to the memory controller 100 as a first read data set (S730).

The semiconductor memory device 200 enables the redundancy repair function associated with the target address ADDR (S740). The semiconductor memory device 200 writes a second write data set including at least one error bit in a memory location corresponding to the target address ADDR in an error injection mode (S750). The semiconductor memory device 200 reads the second write data set including the at least one error bit whit the redundancy repair function enabled and transmits the read second write data set to the memory controller 100 as a second read data set (S760).

The memory controller 100 evaluates (verifies) a redundancy repair function (e.g., a repair on system function) based on a comparison between the first read data set and the second read data set (S770).

Figure 16:
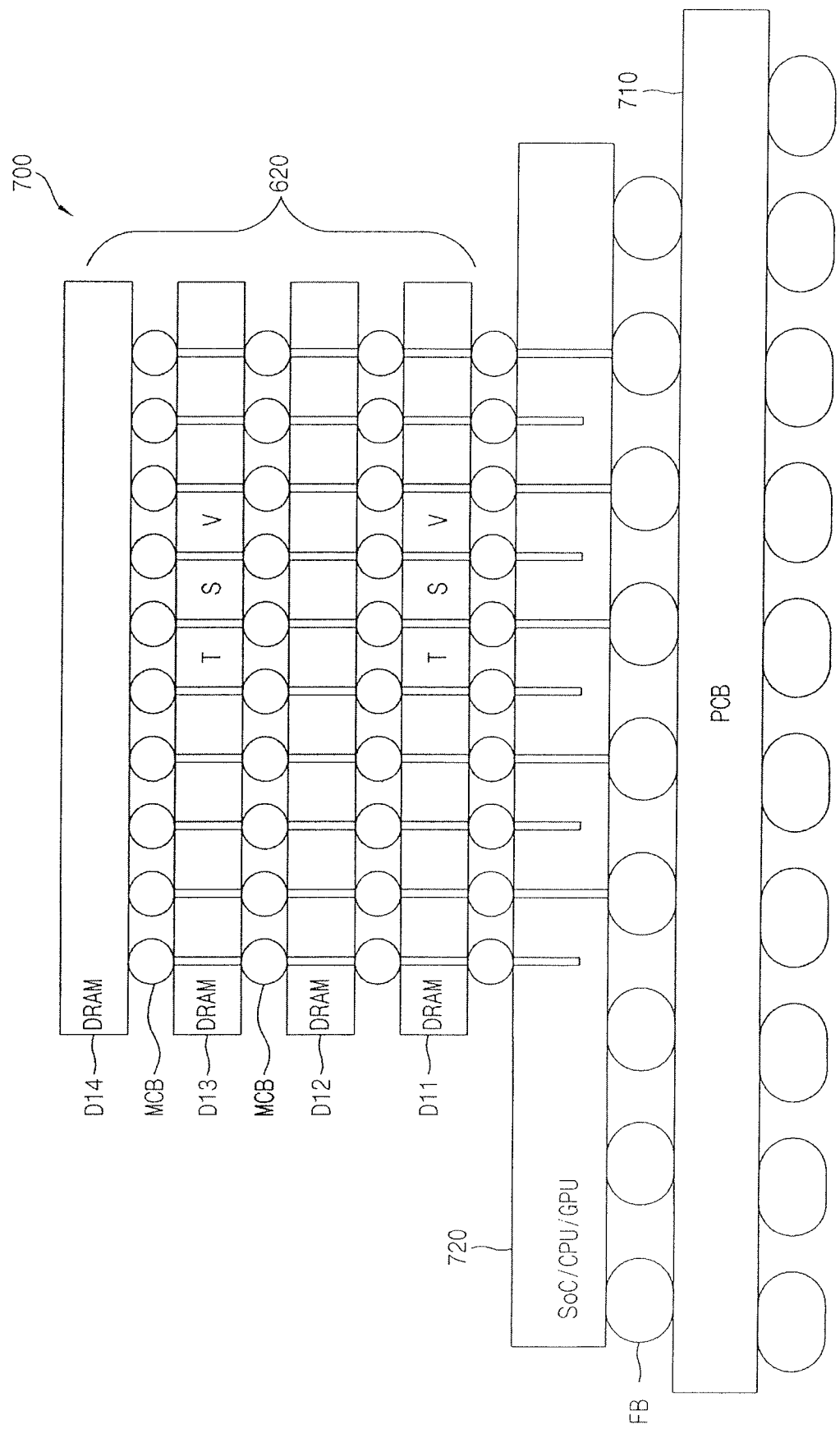
FIG. 16 illustrates an embodiment of a 3D chip structure.

FIG. 16 illustrates a cross-sectional view of a 3D chip structure 700 employing the semiconductor memory device of FIG. 13 according to exemplary embodiments. In FIG. 16, the 3D chip structure 700 is used in the example case where a host and a HBM are directly connected without an interposer layer.

Referring to FIG. 16, a host die 720 (e.g., a system-on-chip (SoC), a central processing unit (CPU), or a graphic processing unit (GPU)) may be disposed on a printed circuit board (PCB) 710 using flip chip bumps FB. Memory dies D11 to D14 may be stacked on the host die 720 to implement a HBM structure. In FIG. 16, the buffer die 610 or a logic die of FIG. 13 is omitted. However, in some embodiments, the buffer die 610 or the logic die may be between the memory die D11 and the host die 710. To implement the HBM (620) structure, TSV lines may be formed at the memory dies D11 and D14. The TSV lines may be electrically connected with micro bumps MCB between memory dies.

Figure 17:
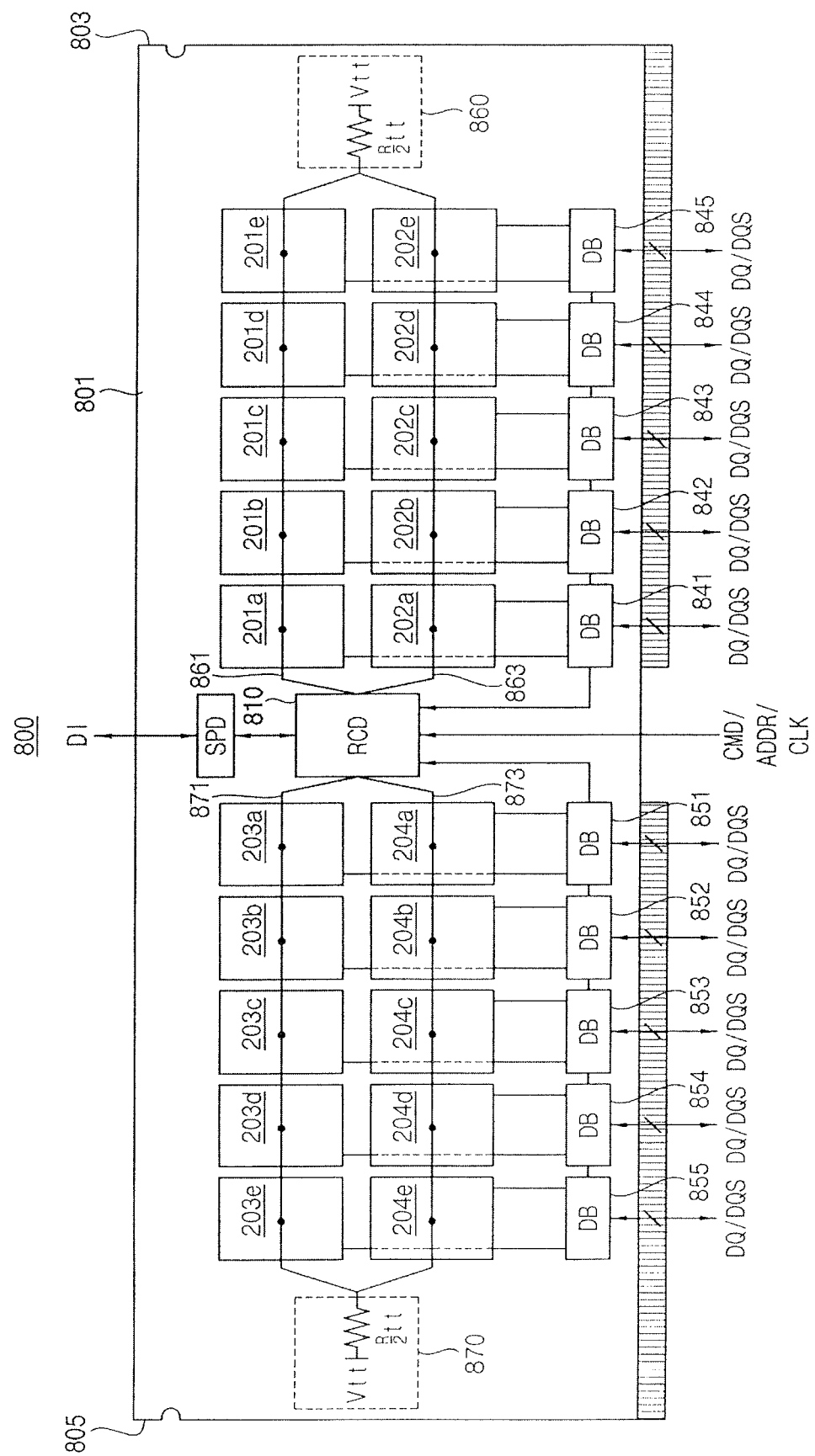
FIG. 17 illustrates an embodiment of a memory module.

FIG. 17 illustrates an embodiment of a memory module 800 which includes a control device 810 disposed (or mounted) in a circuit board 801, a plurality of semiconductor memory devices 201a~201e, 202a~202e, 203a~203e, and 204a~204e, a plurality of data buffers 841~845 and 851~855, a module resistor units 860 and 870, and a serial presence detection chip (SPD) 880. In FIG. 17, the control device 810 (e.g., RCD) may be, for example, a registered clock driver.

The circuit board 801 may be a printed circuit board which extends to a second direction D2, perpendicular to a first direction D1, between a first edge portion 803 and a second edge portion 805 of the first direction D1.

The control device 810 may be on a predetermined location (e.g., a center) of the circuit board 801. The plurality of semiconductor memory devices 201a~201e, 202a~202e, 203a~203e, and 204a~204e may be arranged in a plurality of rows between the control device 810 and the first edge portion 803 and between the control device 810 and the second edge portion 805. The semiconductor memory devices 201a~201e and 202a~202e may be arranged along a plurality of rows between the control device 810 and the first edge portion 803. The semiconductor memory devices 203a~203e, and 204a~204e may be arranged along a plurality of rows between the control device 810 and the second edge portion 805.

A portion of the semiconductor memory devices 201a~201e and 202a~202e may be an error correction code (ECC) memory device. The ECC memory device may perform ECC encoding operation to generate parity bits about data to be written at the memory cells and an ECC decoding operation to correct an error occurring in the data read from the memory cells.

Each of the plurality of semiconductor memory devices 201a~201e, 202a~202e, 203a~203e, and 204a~204e may be coupled to correspond one of the data buffers 841~845 and 851~855 through data transmission line for receiving/transmitting a data signal DQ and a data strobe signal DQS.

The control device 810 may provide a command/address signal to the semiconductor memory devices 201a~201e through a command/address transmission line 861, and may provide a command/address signal to the semiconductor memory devices 202a~202e through a command/address transmission line 863. In addition, the control device 810 may provide a command/address signal to the semiconductor memory devices 203a~203e through a command/address transmission line 871 and may provide a command/address signal to the semiconductor memory devices 204a~204e through a command/address transmission line 873.

The command/address transmission lines 861 and 863 may be connected in common to the module resistance unit 860, which is adjacent to the first edge portion 803. The command/address transmission lines 871 and 873 may be connected in common to the module resistance unit 870, which is adjacent to the second edge portion 805.

Each of the module resistance units 860 and 870 may include a termination resistor Rtt/2 connected to a termination voltage Vtt. The arrangement of the module resistance units 860 and 870 may reduce the number of the module resistance units, thereby reducing an area occupied by termination resistors. In addition, each of the plurality of semiconductor memory devices 201a~201e, 202a~202e, 203a~203e, and 204a~204e may employ, for example, the semiconductor memory device 200 of FIG. 3.

The control device 810 may control the plurality of semiconductor memory devices 201a~201e, 202a~202e, 203a~203e, and 204a~204e under control of a memory controller. For example, the control device 810 may receive an address ADDR, a command CMD, and a clock signal CLK from the memory controller. Based on received signals, the control device 810 may control the semiconductor memory devices 201a~201e, 202a~202e, 203a~203e, and 204a~204e, such that data received through the data signal DQ and the data strobe signal DQS is written in the semiconductor memory devices 201a~201e, 202a~202e, 203a~203e, and 204a~204e or such that data stored in the semiconductor memory devices 201a~201e, 202a~202e, 203a~203e, and 204a~204e is output through the data signal DQ and the data strobe signal DQS.

The SPD 880 may be a programmable read only memory (e.g., EEPROM). The SPD 880 may include initial information or device information DI of the memory module 800. The control device 810 may set at least one of the semiconductor memory devices 201a~201e, 202a~202e, 203a~203e, and 204a~204e to operate in the error injection mode based on the command CMD from the memory controller.

Figure 18:
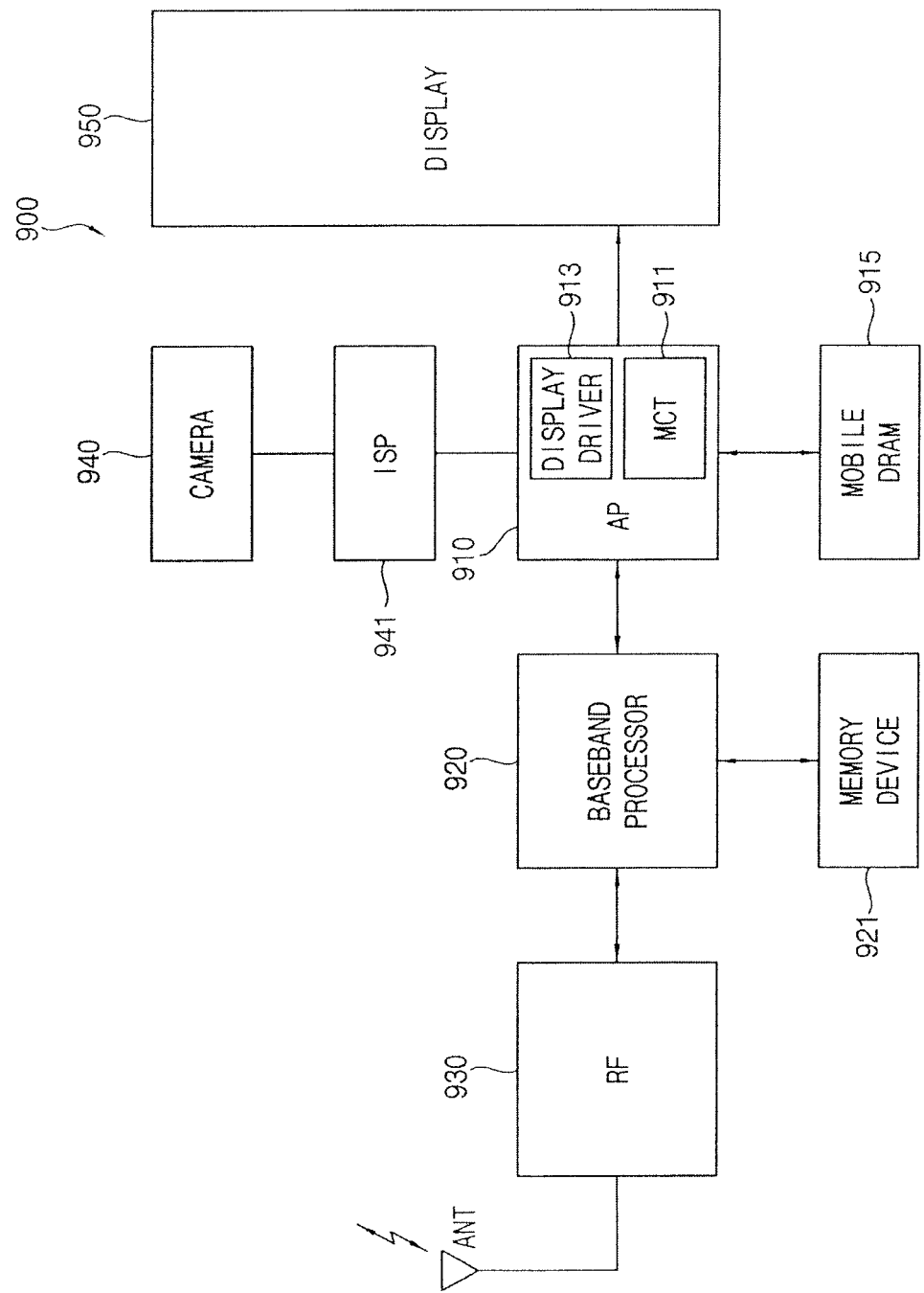
FIG. 18 illustrates an embodiment of a smart phone.

FIG. 18 illustrates an embodiment of a smart phone 900 employing the semiconductor memory device according any of the embodiments described herein. Referring to FIG. 18, the smart phone 900 may be include, for example, a mobile computing device. An application processor AP (e.g., a mobile application processor 910) may control components 915, 920, 941, and 950 of the smart phone 900.

The mobile application processor 910 may use a mobile DRAM 915 as a work memory. A memory device 921 may be used as a work and program memory of a baseband processor 920.

In FIG. 18, the mobile DRAM 915 may be implemented, for example, with the semiconductor memory device 200 of FIG. 3. A memory controller (MCT) 911 in the application processor 910 may control access to the mobile DRAM 915. A display driver 913 in the application processor 910 may control a display 950.

The baseband processor 920 may allow data to be exchanged between a wireless transceiver 930 and the application processor 910. Data processed by the baseband processor 920 may be sent to the application processor 910 or may be stored at the memory device 921. The memory device 921 may be, for example, a volatile memory or a nonvolatile memory.

Wireless data received through an antenna ANT may be transmitted to the baseband processor 920 by way of the wireless transceiver 930. Data output from the baseband processor 920 may be converted to wireless data by the wireless transceiver 930. The converted wireless data may be output through the antenna ANT.

The image signal processor 941 may process a signal from a camera (or an image sensor) 940 and may transfer the processed data to the application processor 910.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, processors, engines, logic or logic circuits, drivers, generators, decoders, and other signal generating, signal providing, and signal processing features of the embodiments disclosed herein may be implemented in non-transitory logic which, for example, may include hardware, software, or both. When implemented at least partially in hardware, the controllers, processors, engines, logic or logic circuits, drivers, generators, decoders, and other signal generating, signal providing, and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, engines, logic or logic circuits, drivers, generators, decoders, and other signal generating, signal providing, and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

In accordance with one or more of the aforementioned embodiments, the semiconductor memory device includes an error injection register set, sets at least one error bit in the error injection register set, and performs write operation and read operation on data set including the at least one error bit. As a result, the semiconductor memory device may reduce costs because the semiconductor memory device confirms responses to various error patterns without an extra error injection card having to be inserted into the semiconductor memory device. Aspects of the present embodiments may be applied to systems, products, or devices using semiconductor memory devices.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor memory device comprising:
a memory cell array configured to have a data set written therein;
an error injection register set configured to store an error bit set, including at least one error bit, based on a first command, the error bit set being associated with the data set;
a data input buffer configured to store the data set based on a second command; and
a write data generator configured to generate a write data set based on the data set and the error bit set; and
control logic configured to control the error injection register set and the data input buffer.

2. The semiconductor memory device as claimed in claim 1, wherein the error bit set includes one of a single bit error, a double bit error, a symbol error, and a data pad error.

3. The semiconductor memory device as claimed in claim 1, wherein:
the data input buffer includes a plurality of input registers, each of the input registers being configured to store a first unit of first data bits corresponding to a burst length of the semiconductor memory device, and
the error injection register set includes:
a plurality of error injection registers, each of the error injection registers being configured to store a second unit of second data bits corresponding to the first data bits of the first unit; and
a register write circuit configured to change a logic level of one of the second data bits based on a control signal from the control logic, in an error injection mode.

4. The semiconductor memory device as claimed in claim 3, wherein:

the write data generator includes a plurality of exclusive OR gates, and
each of the plurality of exclusive OR gates is configured to perform an exclusive OR operation on corresponding bits of the first data bits and the second data bits to provide the write data set.

5. The semiconductor memory device as claimed in claim 3, wherein:
the second data bits have a first logic level as a default logic level,
at least one of the second data bits is set to a second logic level different from the first logic level based on the control signal from the control logic, and
the second data bits represent one of a plurality of error patterns.

6. The semiconductor memory device as claimed in claim 5, wherein:
when the control logic receives the first command and a target address associated with the first command from an external device, the control logic controls the error inject register set such that the data set including the at least one error bit is written in a memory location corresponding to the target address, based on the first command.

7. The semiconductor memory device as claimed in claim 6, wherein the control logic is configured to control the memory cell array such that the write data set including the at least one error bit is read based on a read command from the external device.

8. The semiconductor memory device as claimed in claim 1, wherein the control logic is configured to disable a repair function of the semiconductor memory device when the write data set including the at least one error bit is written in the memory cell array based on the first command and the second command.

9. The semiconductor memory device as claimed in claim 1, wherein the memory cell array includes a plurality of dynamic memory cells connected to a plurality of word-lines and a plurality of bit-lines.

10. The semiconductor memory device as claimed in claim 1, further comprising an error correction code (ECC) engine connected between the memory cell array and the write data generator,
wherein the ECC engine is configured to generate parity bits based on the write data including the at least one error bit, and is configured to write the parity bits in a parity cell region of the memory cell array.

11. The semiconductor memory device as claimed in claim 10, wherein:
the memory cell array includes a plurality of bank arrays, and
each of the plurality of bank arrays includes:
a normal cell region configured to store the write data set; and
a redundancy cell region configured to store the parity bits.

12. The semiconductor memory device as claimed in claim 10, wherein:
the semiconductor memory device includes:
first group dies including at least one buffer die; and
second group dies including a plurality of memory dies, the plurality of memory dies being stacked on the first group dies and being configured to convey data through a plurality of through silicon via (TSV) lines,
each of the plurality of memory dies includes the memory cell array, and
at least one of the plurality of memory dies includes the error injection register set.

13. A memory system, comprising:
at least one semiconductor memory device; and
a memory controller configured to control the at least one semiconductor memory device, wherein the at least one semiconductor memory device includes:
a memory cell array configured to have a data set written therein;
an error injection register set configured to store an error bit set, including at least one error bit, based on a first command from the memory controller, the error bit set being associated with the data set;
a data input buffer configured to store the data set based on a second command from the memory controller; and
a write data generator configured to generate a write data set based on the data set and the error bit set; and
control logic configured to control the error injection register set and the data input buffer.

14. The memory system as claimed in claim 13, wherein:
the data input buffer includes a plurality of input registers, each of the input registers being configured to store a first unit of first data bits corresponding to a burst length of the semiconductor memory device, and
the error injection register set includes:
a plurality of error injection registers, each of the error injection registers being configured to store a second unit of second data bits corresponding to the first data bits of the first unit; and
a register write circuit configured to change a logic level of one of the second data bits based on a control signal from the control logic in an error injection mode.

15. The memory system of claim 14, wherein:
the write data generator includes a plurality of exclusive OR gates, and
each of the plurality of exclusive OR gates is configured to perform an exclusive OR operation on corresponding bits of the first data bits and the second data bits to provide the write data set.

16. The memory system of claim 14, wherein:
the second data bits have a first logic level as a default logic level,
at least one of the second data bits is set to a second logic level different from the first logic level based on the control signal from the control logic,
the second data bits represent one of a plurality of error patterns, and
when the control logic receives the first command and a target address associated with the first command from the memory controller, the control logic controls the error inject register set such that the write data set including the at least one error bit is written in a memory location corresponding to the target address based on the first command.

17. The memory system as claimed in claim 16, wherein:
the control logic is configured to control the memory cell array such that the write data set including the at least one error bit is read based on a read command from the memory controller, and
wherein the memory controller includes:
an error correction code (ECC) engine configured to receive the write data set including the at least one error bit, and configured to evaluate an error correction capability at a system level based on the write data set including the at least one error bit; and an error log register in which error information of the write data set including the at least one error bit is logged.

18. The memory system as claimed in claim 13, wherein:

when the memory controller applies the first command to the semiconductor memory device, the memory controller writes a first write data set including the at least one error bit in the memory cell array by disabling a repair function of the semiconductor memory device, and reads the first write data set written in the memory cell array as a first read data set, when the memory controller applies the first command to the semiconductor memory device again, the memory controller writes a second write data set including the at least one error bit in the memory cell array by enabling the repair function of the semiconductor memory device, and reads the second write data set written in the memory cell array as a second read data set, and the memory controller is configured to evaluate a redundancy repair function of the memory system based on a comparison between the first read data set and the second read data set.

19. A method of operating a semiconductor memory device including a memory cell array configured to have a data set written therein, the method comprising:

writing an error bit set, including at least one error bit, in an error injection register set based on a first command from a memory controller, the error bit set being associated with the data set;

storing the data set in a data input buffer based on a second command from the memory controller;

generating a write data set based on the data set and the error bit set;

writing the write data set in a memory location designated by a target address; and reading the write data set from the memory location, based on a read command from the memory controller, and transmitting the read write data set as a read data set to the memory controller.

20. The method as claimed in claim 19, wherein:

the error bit set includes one of a single bit error, a double bit error, a symbol error, or a data pad error;

the semiconductor memory device includes first group dies including at least one buffer die and second group dies including a plurality of memory dies stacked on the first group dies, the method includes conveying data from the plurality of memory dies through a plurality of through silicon via (TSV) lines, and the semiconductor memory device is a high bandwidth memory (HBM).

* * * * *